(12) United States Patent
Igarashi (10) Patent No.: US 11,817,422 B2
(45) Date of Patent: Nov. 14, 2023

(54) SEMICONDUCTOR DEVICE (71) Applicant: SHINKO ELECTRIC INDUSTRIES CO., LTD., Nagano (JP)

(72) Inventor: Yohei Igarashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 230 days.

(21) Appl. No.: 16/679,180

(22) Filed: Nov. 9, 2019

(65) Prior Publication Data
US 2020/0152601 A1    May 14, 2020

(30) Foreign Application Priority Data
Nov. 13, 2018  (JP) .................................. 2018-212921

(51) Int. Cl.
*H01L 25/065* (2023.01)
*H01L 25/18* (2023.01)
(Continued)

(52) U.S. Cl.
CPC .......... *H01L 25/0652* (2013.01); *H01L 23/36* (2013.01); *H01L 23/4334* (2013.01);
(Continued)

(58) Field of Classification Search
CPC . H01L 23/49816; H01L 23/488; H01L 24/16; H01L 24/17; H01L 24/95;
(Continued)

(56) References Cited

U.S. PATENT DOCUMENTS 7,254,033 B2 * 8/2007 Jafari ..................... H01L 23/467
361/705
7,749,888 B2 * 7/2010 Nishiyama .............. H01L 24/03
438/612
(Continued)

FOREIGN PATENT DOCUMENTS

JP    2004296807 A  * 10/2004
JP    2010034436 A    2/2010
(Continued)

OTHER PUBLICATIONS

Office Action issued in connection with Japanese Application No. 2018-212921, dated Oct. 4, 2022.

*Primary Examiner* — Erik T. K. Peterson
(74) *Attorney, Agent, or Firm* — Tarolli, Sundheim, Covell & Tummino, LLP (57) ABSTRACT

A semiconductor device includes a first semiconductor element, a first connection terminal formed on a lower surface of the first semiconductor element, a second semiconductor element mounted on the lower surface of the first semiconductor element so that the second semiconductor element partially overlaps the first semiconductor element in plan view, a second connection terminal formed on a lower surface of the second semiconductor element, and a wiring substrate on which the first and second semiconductor elements are mounted. The wiring substrate includes first and second connection pads electrically connected to the first connection terminal and the second connection terminal, respectively. The semiconductor device further includes a third connection terminal formed on the first connection pad and electrically connected to the first connection terminal. One of the first connection terminal and the third connection terminal is a metal post, and the other is a solder ball.

6 Claims, 7 Drawing Sheets

(51) Int. Cl.

| | |
|---|---|
| *H01L 23/00* | (2006.01) |
| *H01L 25/00* | (2006.01) |
| *H01L 23/433* | (2006.01) |
| *H01L 23/498* | (2006.01) |
| *H01L 23/36* | (2006.01) |
| *H01L 25/07* | (2006.01) |
| *H01L 49/02* | (2006.01) |

(52) U.S. Cl.
CPC ........ *H01L 23/49811* (2013.01); *H01L 24/13* (2013.01); *H01L 24/16* (2013.01); *H01L 24/32* (2013.01); *H01L 24/81* (2013.01); *H01L 24/97* (2013.01); *H01L 25/18* (2013.01); *H01L 25/50* (2013.01); *H01L 25/071* (2013.01); *H01L 28/10* (2013.01); *H01L 2224/16238* (2013.01); *H01L 2225/06503* (2013.01); *H01L 2225/06513* (2013.01); *H01L 2225/06517* (2013.01); *H01L 2225/06531* (2013.01); *H01L 2225/06555* (2013.01); *H01L 2225/06589* (2013.01)

(58) Field of Classification Search
CPC . H01L 25/0652; H01L 25/071; H01L 25/074; H01L 25/0756; H01L 25/117; H01L 2224/81815; H01L 2225/06503; H01L 2225/06555; H01L 2225/06517; H01L 2225/06513; H01L 2225/06589; H01L 23/16–18; H01L 23/28–3192; H01L 23/42; H01L 23/36; H01L 23/3735; H01L 23/3736

See application file for complete search history.

(56) References Cited

U.S. PATENT DOCUMENTS

| | | | | |
|---|---|---|---|---|
| 8,564,957 B2* | 10/2013 | Usui | .................. | H05K 7/20509 361/720 |
| 8,941,233 B1* | 1/2015 | Ngai | ................. | H01L 21/76898 257/706 |
| 9,269,694 B2 | 2/2016 | Chen | .................. | H01L 23/3675 |
| 9,553,071 B1* | 1/2017 | Haba | ................... | H01L 25/0652 |
| 9,799,628 B2* | 10/2017 | Kim | .................... | H01L 24/16 |
| 9,806,066 B2* | 10/2017 | Du | .................... | H01L 25/50 |
| 11,404,346 B2* | 8/2022 | Kim | .................... | H01L 21/4871 |
| 2002/0070463 A1* | 6/2002 | Chang | ....................... | F41J 1/00 257/780 |
| 2003/0094700 A1* | 5/2003 | Aiba | ....................... | H01L 24/13 257/778 |
| 2005/0068739 A1* | 3/2005 | Arvelo | ............... | H01L 23/3675 257/E23.09 |
| 2005/0205993 A1* | 9/2005 | Yamaguchi | ............. | H01L 24/12 257/738 |
| 2006/0044772 A1* | 3/2006 | Miura | ................... | H01L 25/072 257/E23.101 |
| 2006/0081047 A1* | 4/2006 | Saeki | ...................... | B81B 7/007 73/514.16 |
| 2006/0086186 A1* | 4/2006 | Ichikawa | ............. | G01P 15/123 73/514.36 |
| 2007/0075410 A1* | 4/2007 | Chan | .................... | H01L 21/563 257/678 |
| 2008/0142954 A1* | 6/2008 | Hu | ..................... | H01L 25/0655 257/713 |
| 2008/0184555 A1* | 8/2008 | Machida | ............... | H05K 3/4647 29/830 |
| 2008/0211081 A1* | 9/2008 | Lee | ......................... | H01L 24/12 257/691 |
| 2008/0251281 A1* | 10/2008 | Buchwalter | ............. | H01L 24/11 174/255 |
| 2009/0072407 A1* | 3/2009 | Furman | ................... | H01L 25/50 257/762 |
| 2009/0075469 A1* | 3/2009 | Furman | ................... | H01L 24/11 438/613 |
| 2009/0127700 A1* | 5/2009 | Romig | ............... | H01L 23/4334 257/E23.101 |
| 2009/0166888 A1* | 7/2009 | Pozder | ................... | H01L 24/13 257/777 |
| 2010/0176510 A1* | 7/2010 | Pendse | ................... | H01L 24/03 257/737 |
| 2010/0193936 A1* | 8/2010 | Tanie | ............... | H01L 23/49816 257/693 |
| 2012/0267777 A1 | 10/2012 | Haba | | |
| 2013/0161776 A1* | 6/2013 | Iizuka | .................. | H01L 21/563 257/433 |
| 2014/0048951 A1* | 2/2014 | Lin | .................. | H01L 23/49833 257/774 |
| 2014/0063764 A1 | 3/2014 | Tanaka | | |
| 2014/0159236 A1* | 6/2014 | Kim | ........................ | H01L 24/81 257/737 |
| 2014/0225248 A1* | 8/2014 | Henderson | ............. | H01L 23/36 257/712 |
| 2014/0264799 A1* | 9/2014 | Gowda | ............. | H01L 23/49575 438/122 |
| 2014/0264800 A1* | 9/2014 | Gowda | ............. | H01L 23/49541 438/122 |
| 2014/0346672 A1* | 11/2014 | Lin | ........................ | H01L 24/16 257/737 |
| 2014/0357021 A1 | 12/2014 | Haba | | |
| 2015/0028474 A1* | 1/2015 | Jang | ................. | H01L 23/49827 257/737 |
| 2015/0061118 A1* | 3/2015 | Chen | .................. | B23K 1/0016 257/737 |
| 2015/0236002 A1 | 8/2015 | Haba | | |
| 2016/0190053 A1* | 6/2016 | Machida | ............. | H01L 21/4853 361/768 |
| 2017/0040246 A1* | 2/2017 | Shuto | .................. | H01L 23/5227 |
| 2017/0077053 A1* | 3/2017 | Keser | .................... | H01L 21/565 |
| 2018/0108602 A1* | 4/2018 | Yeh | .................. | H01L 23/3128 |
| 2018/0116053 A1* | 4/2018 | Lin | ......................... | H01L 24/11 |
| 2019/0206807 A1* | 7/2019 | Cho | .................. | H01L 25/0655 |
| 2019/0214328 A1* | 7/2019 | Eid | .................. | H01L 23/4334 |
| 2019/0311978 A1* | 10/2019 | Cheah | ................ | H05K 3/3436 |
| 2020/0312803 A1* | 10/2020 | Yao | ....................... | H01L 24/16 |

FOREIGN PATENT DOCUMENTS

| | | |
|---|---|---|
| JP | 2014038880 A | 2/2014 |
| JP | 2014-049477 A | 3/2014 |
| JP | 2014-512691 A | 5/2014 |

* cited by examiner

SEMICONDUCTOR DEVICE

CROSS-REFERENCE TO RELATED APPLICATIONS

This application is based upon and claims the benefit of priority from prior Japanese Patent Application No. 2018-212921, filed on Nov. 13, 2018, the entire contents of which are incorporated herein by reference.

FIELD

This disclosure is related to a semiconductor device and a method for manufacturing a semiconductor device.

BACKGROUND

Recent semiconductor elements such as ICs and LSIs used in electronic devices have been highly integrated and increased capacity in accordance with demands for highly sophisticated compact electronic devices. In addition, there are demands for compact, slim, highly integrated semiconductor devices (packages) on which semiconductor elements are mounted. To respond to such demands, a system in package (SiP), in which multiple semiconductor elements are mounted on a single wiring substrate, is commercialized.

Japanese Laid-Open Patent Publication Nos. 2010-34436 and 2014-38880 describe this type of semiconductor device in which multiple semiconductor elements are stacked on a single wiring substrate. Various processes such as flip-chip connection or wire bonding connection are used as the process for connecting multiple semiconductor elements to a wiring substrate.

SUMMARY

In the semiconductor device described above, the connection reliability between the wiring substrate and the semiconductor elements needs to be improved.

An embodiment of this disclosure is a semiconductor device that includes a first semiconductor element, a first connection terminal formed on a lower surface of the first semiconductor element, a second semiconductor element mounted on the lower surface of the first semiconductor element so that the second semiconductor element partially overlaps the first semiconductor element in plan view, a second connection terminal formed on a lower surface of the second semiconductor element, a wiring substrate including a first connection pad electrically connected to the first connection terminal and a second connection pad electrically connected to the second connection terminal so that the first semiconductor element and the second semiconductor element are mounted over the wiring substrate, and a third connection terminal formed on the first connection pad and electrically connected to the first connection terminal. One of the first connection terminal and the third connection terminal is a metal post. The other one of the first connection terminal and the third connection terminal is a solder ball.

Other embodiments and advantages thereof will become apparent from the following description, taken in conjunction with the accompanying drawings, illustrating by way of example the principles of the invention.

It is to be understood that both the foregoing general description and the following detailed description are exemplary and explanatory and are not restrictive of the invention, as claimed.

BRIEF DESCRIPTION OF THE DRAWINGS

The embodiments, together with objects and advantages thereof, may best be understood by reference to the following description of the presently preferred embodiments together with the accompanying drawings in which.

DESCRIPTION OF THE EMBODIMENTS

Embodiments will now be described with reference to the drawings. Elements in the drawings may be partially enlarged for simplicity and clarity and thus have not necessarily been drawn to scale. To facilitate understanding, hatching lines may not be illustrated or be replaced by shadings in the cross-sectional drawings. In this specification, "plan view" refers to a view of a subject taken in a vertical direction (for example, upper-lower direction in FIG. 1), and "planar shape" refers to a shape of a subject taken in the vertical direction.

The structure of a semiconductor device 10 will now be described.

Figure 1:
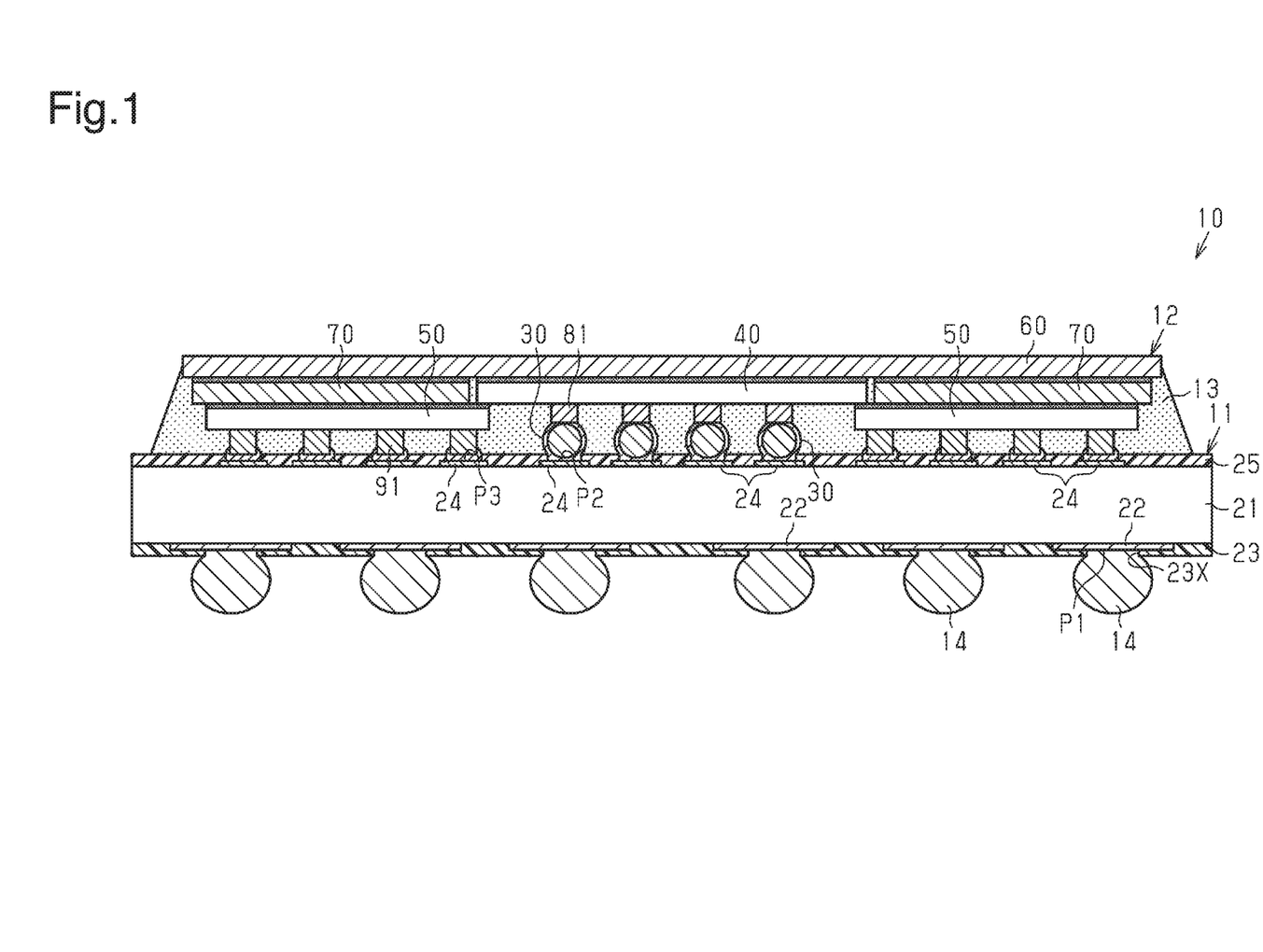
FIG. 1 is a schematic cross-sectional view taken along line 1-1 in FIG. 3 illustrating an embodiment of a semiconductor device.

As illustrated in FIG. 1, the semiconductor device 10 includes a wiring substrate 11, a mount portion 12 mounted on the wiring substrate 11, and an underfill resin 13 disposed between the wiring substrate 11 and the mount portion 12. The mount portion 12 includes semiconductor elements 40 and 50 mounted over the wiring substrate 11 and a heat dissipation plate 60.

The wiring substrate 11 includes a substrate body 21. A wiring layer 22 and a solder resist layer 23 are sequentially stacked on the lower surface of the substrate body 21. A wiring layer 24 and a solder resist layer 25 are sequentially stacked on the upper surface of the substrate body 21.

The substrate body 21 may have any inner layer structure as long as the wiring layer 22 is electrically connected to the wiring layer 24 through the inner layer structure of the substrate body 21. For example, the substrate body 21 may include one or more inner wiring layers but does not have to include inner wiring layers. For example, the substrate body 21 may include inner wiring layers and interlayer insulation layers that are alternately stacked. In this case, the wiring layer 22 is electrically connected to the wiring layer 24 by via wirings that extend through the inner wiring layers and the interlayer insulation layers. For example, a build-up core substrate including a core substrate or a coreless substrate that does not include a core substrate may be used as the substrate body 21 having the above configuration. When a coreless substrate is used as the substrate body 21, for example, the side and upper surfaces of the lowermost wiring layer (wiring layer 22) may be embedded in the lowermost insulation layer of the substrate body 21 so that the lower surface of the lowermost wiring layer (wiring layer 22) is exposed from the lowermost insulation layer of the substrate body 21. When the substrate body 21 does not include inner wiring layers, for example, the wiring layer 22 is electrically connected to the wiring layer 24 by through electrodes that extend through the substrate body 21 in the thickness-wise direction.

The material of the wiring layers 22 and 24 may be, for example, copper (Cu) or a copper alloy. The material of the solder resist layers 23 and 25 may be, for example, a photosensitive insulative resin including a phenol resin or a polyimide resin as a main component. The solder resist layers 23 and 25 may include, for example, a filler such as silica or alumina.

The wiring layer 22 is formed on the lower surface of the substrate body 21. The wiring layer 22 is electrically connected to the wiring layer 24 via, for example, the inner wiring layers or through electrodes of the substrate body 21, which are described above. The wiring layer 22 is, for example, the lowermost wiring layer of the wiring substrate 11.

The solder resist layer 23 is formed on the lower surface of the substrate body 21 to partially cover the wiring layer 22. The solder resist layer 23 is the outermost insulation layer (here, lowermost insulation layer) of the wiring substrate 11. The solder resist layer 23 includes openings 23X extending through the solder resist layer 23 in the thickness-wise direction to partially expose the lower surface of the wiring layer 22 as external connection pads P1. External connection terminals 14 are formed on the external connection pads P1. The external connection terminals 14 are used, for example, for electrical connection with pads that are disposed on a mount substrate such as a motherboard (not illustrated). The external connection terminals 14 may be, for example, solder balls or lead pins. In the present embodiment, solder balls may be used as the external connection terminals 14.

The wiring layer 24 is formed on the upper surface of the substrate body 21. The wiring layer 24 is, for example, the uppermost wiring layer of the wiring substrate 11.

The solder resist layer 25 is formed on the upper surface of the substrate body 21 to partially cover the wiring layer 24. The solder resist layer 25 is the outermost insulation layer (here, uppermost insulation layer) of the wiring substrate 11. The thickness of the solder resist layer 25 from the upper surface of the wiring layer 24 to the upper surface of the solder resist layer 25 may be, for example, approximately 5 to 25 μm.

Figure 2:
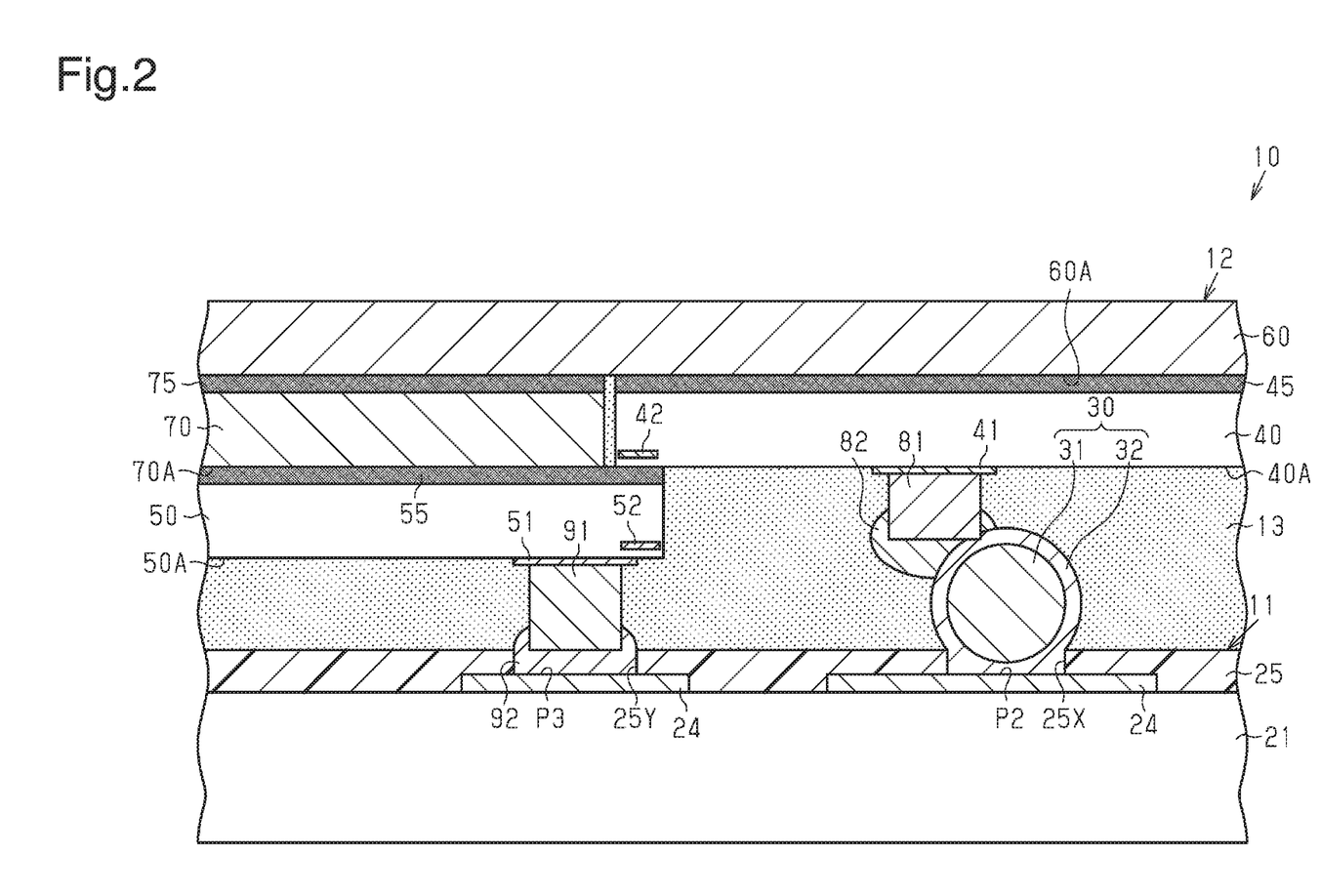
FIG. 2 is an enlarged cross-sectional view of the semiconductor device illustrated in FIG. 1.

As illustrated in FIG. 2, the solder resist layer 25 includes openings 25X extending through the solder resist layer 25 in the thickness-wise direction to partially expose the upper surface of the wiring layer 24 as connection pads P2. The solder resist layer 25 further includes openings 25Y extending through the solder resist layer 25 in the thickness-wise direction to partially expose the upper surface of the wiring layer 24 as connection pads P3. The connection pads P2 are electrically connected to the semiconductor element 40. The connection pads P2 are arranged in accordance with the layout of electrode pads 41 of the semiconductor element 40. For example, each connection pad P2 is disposed to face one of the electrode pads 41 of the semiconductor element 40. The connection pads P3 are electrically connected to the semiconductor element 50. The connection pads P3 are arranged in accordance with the layout of electrode pads 51 of the semiconductor element 50. For example, each connection pad P3 is disposed to face one of the electrode pads 51 of the semiconductor element 50.

Figure 3:
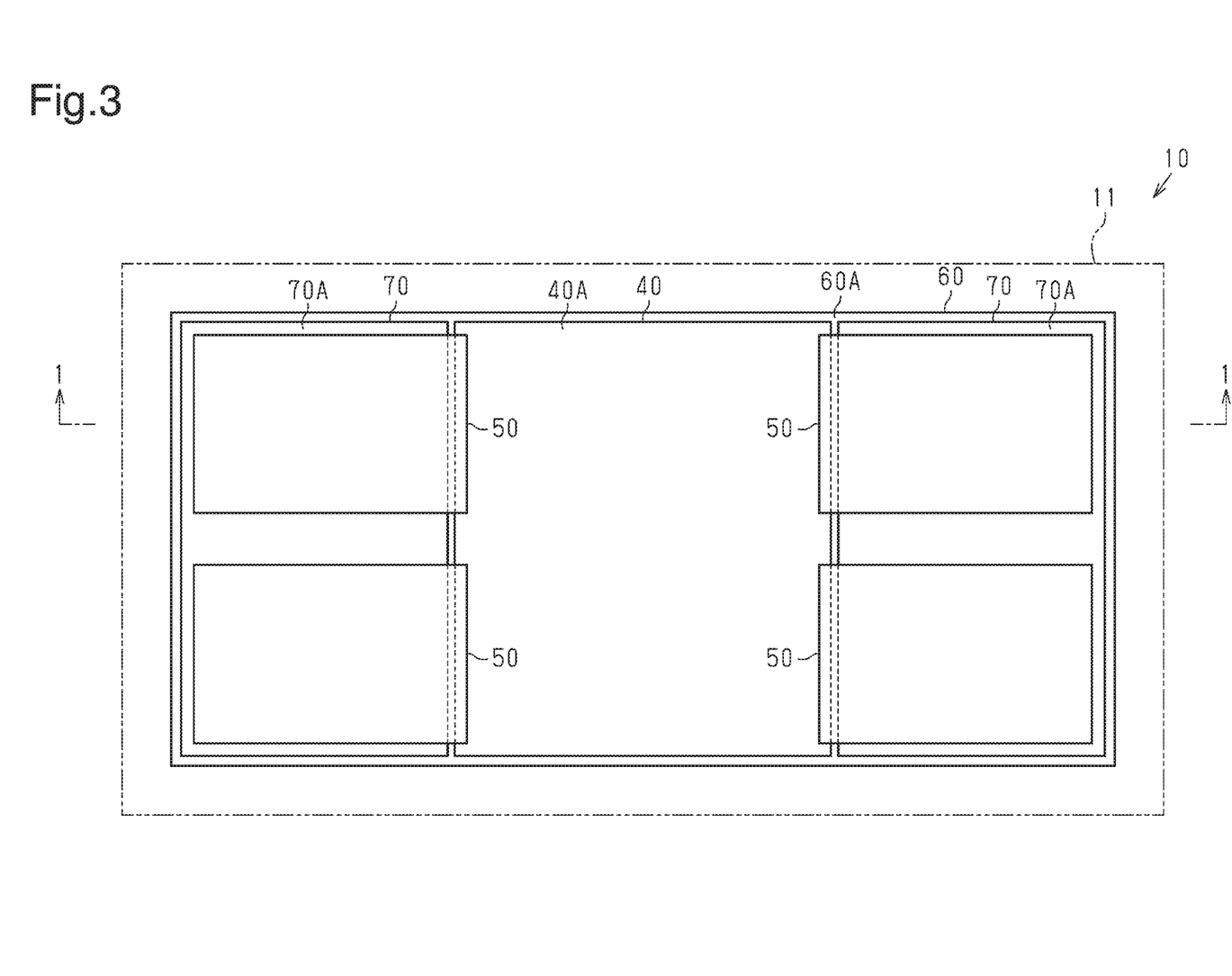
FIG. 3 is a schematic plan view of the semiconductor device illustrated in FIG. 1 taken from a lower side.

The structure of the mount portion 12 will now be described with reference to FIGS. 2 and 3. FIG. 3 is a plan view of the semiconductor device 10 illustrated in FIG. 1 taken from a lower side. In FIG. 3, the wiring substrate 11 is transparently illustrated.

As illustrated in FIG. 3, one or more (here, one) semiconductor elements 40 and one or more (here, two) spacers 70 are mounted on (bonded to) a lower surface 60A of the heat dissipation plate 60. One or more (here, four) semiconductor elements 50 are mounted on (bonded to) lower surfaces 70A of the spacers 70. The semiconductor element 40 is disposed, for example, on a central portion of the lower surface 60A of the heat dissipation plate 60 in plan view. Each spacer 70 is disposed on the lower surface 60A of the heat dissipation plate 60 in a peripheral region that is located at an outer side of the semiconductor element 40. In the example illustrated in FIG. 3, the semiconductor element 40 is disposed between the two spacers 70 located at left and right sides in plan view. Each semiconductor element 50 is disposed, for example, mostly on the lower surfaces 70A of the spacers 70 and partially on a lower surface 40A of the semiconductor element 40.

In the present embodiment, the heat dissipation plate 60 is smaller in size than the wiring substrate 11 in plan view. The side surfaces of the semiconductor element 40 are spaced apart (retracted) from the side surfaces of the heat dissipation plate 60 toward the inner side of the semiconductor device 10. The side surfaces of each spacer 70 are also spaced apart from the side surfaces of the heat dissipation plate 60 toward the inner side of the semiconductor device 10. The side surfaces of each semiconductor element 50 are also spaced apart from the side surfaces of the heat dissipation plate 60 (as well as side surfaces of the spacers 70 and side surfaces of the semiconductor element 40) toward the inner side of the semiconductor device 10.

The heat dissipation plate 60 is, for example, a plate that is rectangular in plan view. The heat dissipation plate 60 is also referred to as a heat spreader. The heat dissipation plate 60 is, for example, used to disperse concentration of heat generated by the semiconductor element 40. The heat dissipation plate 60 is disposed on the semiconductor elements 40 and 50. Thus, the heat dissipation plate 60 is also used to mechanically protect the semiconductor elements 40 and 50. Further, the heat dissipation plate 60 is used as a support substrate that supports the semiconductor elements 40 and 50. For example, a material having satisfactory thermal conductivity may be used as the material of the heat dissipation plate 60. For example, a substrate formed from copper (Cu), silver (Ag), aluminum (Al) or an alloy of these metals may be used as the heat dissipation plate 60. Alternatively, a substrate formed from an insulation material or a semiconductor material having high thermal conductivity, for example, ceramics such as alumina or aluminum nitride or silicon, may be used as the heat dissipation plate 60. When silicon is used as the material of the heat dissipation plate 60, for example, an insulation film may be formed on the surface of silicon to ensure insulation properties. The insulation film may be, for example, a silicon oxide film obtained by performing a thermal oxidation process on silicon. The thickness of the heat dissipation plate 60 may be approximately 500 to 1000 μm.

As illustrated in FIG. 2, the semiconductor element 40 is adhered to the lower surface 60A of the heat dissipation plate 60, for example, with an adhesive layer 45. The adhesive layer 45 is adhered to the lower surface 60A of the heat dissipation plate 60 and the upper surface of the semiconductor element 40.

The semiconductor element 40 may be, for example, a logic chip such as a central processing unit (CPU) chip, a micro processing unit (MPU) chip, or a graphics processing unit (GPU) chip. The semiconductor element 40 may be, for example, a memory chip such as a dynamic random access memory (DRAM) chip, a static random access memory (SRAM) chip, or a flash memory chip. In the present embodiment, the semiconductor element 40 is an MPU chip.

The electrode pads 41 are formed on the lower surface 40A of the semiconductor element 40. For example, the semiconductor element 40 includes a thin semiconductor substrate formed of silicon (Si) or the like. The semiconductor substrate (semiconductor element 40) includes a circuit formation surface (in FIG. 2, lower surface 40A) that includes a semiconductor integrated circuit (not illustrated) and is covered with a protection film (not illustrated). The electrode pads 41 are disposed on the circuit formation surface and exposed from the protection film (not illustrated). Each electrode pad 41 is disposed to face one of the connection pads P2 formed on the wiring substrate 11. The material of the electrode pads 41 may be, for example, copper, aluminum, or an alloy of these metals.

In the present embodiment, the semiconductor element 40 includes a coil 42. For example, the coil 42 is formed in the semiconductor integrated circuit of the semiconductor element 40. In the present example, the coil 42 is incorporated into the semiconductor element 40. The coil 42 may be configured, for example, by a wiring pattern wound once or more.

The semiconductor element 40 may have any planar shape and any size. The semiconductor element 40 is, for example, rectangular in plan view. The dimensions of the semiconductor element 40 may be, for example, approximately 25 mm×25 mm in plan view. The thickness of the semiconductor element 40 may be, for example, approximately 500 to 1000 μm.

The adhesive layer 45 may be, for example, an epoxy-based, polyimide-based, or silicone-based thermosetting adhesive or a thermal interface material (TIM). The material of the thermal interface material may be, for example, a soft metal such as indium (In) or silver, silicone gel, or an organic resin binder containing a metal filler or graphite. For example, the adhesive layer 45 is used to thermally connect the semiconductor element 40 to the heat dissipation plate 60 in addition to adhering the semiconductor element 40 and the heat dissipation plate 60. The thickness of the adhesive layer 45 may be, for example, approximately 20 to 50 μm.

Each spacer 70 is adhered to the lower surface 60A of the heat dissipation plate 60, for example, with an adhesive layer 75. Each adhesive layer 75 is adhered to the lower surface 60A of the heat dissipation plate 60 and the upper surface of the spacer 70. The lower surface 70A of each spacer 70 is coplanar with or substantially coplanar with the lower surface 40A of the semiconductor element 40. Each spacer 70 is used to maintain the distance (separation distance) between the lower surface 60A of the heat dissipation plate 60 and the upper surface of the semiconductor element 50 at a specified value. Each spacer 70 is separate from, for example, the semiconductor element 40 and the adhesive layer 45. Each adhesive layer 75 is separate from, for example, the semiconductor element 40 and the adhesive layer 45.

Any material may be used for the spacers 70. Preferably, the material of the spacers 70 is, for example, a material that may undergo high precision machining so that the precision of thickness is satisfactory. The material of the spacers 70 may be, for example, ceramics such as alumina or aluminum nitride, or silicon. The material of the spacers 70 may be, for example, copper, silver, aluminum, or an alloy of these metals. The thickness of each spacer 70 may be, for example, approximately 500 to 1000 μm.

The adhesive layers 75 may be, for example, an epoxy-based, polyimide-based, or silicone-based thermosetting adhesive or a thermal interface material. The material of the adhesive layers 75 may be the same as the material of the adhesive layer 45 or may differ from the material of the adhesive layer 45. The thickness of each adhesive layer 75 may be, for example, approximately 20 to 50 μm.

Each semiconductor element 50 is adhered to the lower surface 70A of the spacer 70 and the lower surface 40A of the semiconductor element 40, for example, with an adhesive layer 55. The adhesive layer 55 and the semiconductor element 50 are disposed to bridge the spacer 70 and the semiconductor element 40. For example, the semiconductor element 50 is mostly bonded to the lower surface 70A of the spacer 70 with the adhesive layer 55 and partially bonded to the lower surface 40A of the semiconductor element 40 with the adhesive layer 55. As illustrated in FIG. 3, in the present embodiment, two semiconductor elements 50 are bonded to the lower surface 70A of each spacer 70, and four semiconductor elements 50 are bonded to the lower surface 40A of the semiconductor element 40.

Each semiconductor element 50 may be, for example, a memory chip such as a DRAM chip, an SRAM chip, or a flash memory chip. Also, the semiconductor element 50 may be, for example, a logic chip such as a CPU chip, an MPU chip, or a GPU chip. In the present embodiment, each semiconductor element 50 is a DRAM chip.

As illustrated in FIG. 2, the electrode pads 51 are formed on a lower surface 50A of each semiconductor element 50. For example, each semiconductor element 50 includes a thin semiconductor substrate formed of silicon (Si) or the like. The semiconductor substrate (semiconductor element 50) includes a circuit formation surface (in FIG. 2, lower surface 50A) that includes a semiconductor integrated circuit (not illustrated) and is covered with a protection film (not illustrated). The electrode pads 51 are disposed on the circuit formation surface and exposed from the protection film (not illustrated). Each electrode pad 51 is disposed to face one of the connection pads P3 formed on the wiring substrate 11. The material of the electrode pads 51 may be, for example, copper, aluminum, or an alloy of these metals.

In the present embodiment, the semiconductor element 50 includes a coil 52. For example, the coil 52 is formed in the semiconductor integrated circuit of the semiconductor element 50. In the present example, the semiconductor element 50 incorporates the coil 52. The coil 52 may be configured, for example, by a wiring pattern wound once or more. The semiconductor element 50 is disposed to partially overlap the semiconductor element 40 in plan view so that the coil 52 incorporated in the semiconductor element 50 overlaps the coil 42 incorporated in the semiconductor element 40 in plan view. The semiconductor element 40 and the semiconductor element 50 are magnetically coupled to each other. For example, the semiconductor elements 40 and 50 may be connected to each other through electromagnetic inductive coupling. For example, the coil 42 of the semiconductor element 40 may be used as a data transmission side, and the coil 52 of the semiconductor element 50 may be used as a data reception side. In this case, electric current flows to the coil 42 to produce magnetic field, and the coil 52 receives the magnetic field. When the magnetic field is converted into electric current, information is transmitted from the semiconductor element 40 to the semiconductor element 50. In the present embodiment, the semiconductor element 40 is magnetically coupled to each of the four semiconductor elements 50.

Each semiconductor element 50 may have any planar shape and any size. The semiconductor element 50 is, for example, rectangular in plan view. The dimensions of the semiconductor element 50 may be, for example, approximately 20 mm×10 mm in plan view. The thickness of the semiconductor element 50 may be, for example, approximately 50 to 100 μm.

The adhesive layer 55 may be, for example, an epoxy-based, polyimide-based, or silicone-based thermosetting adhesive or a thermal interface material. The material of the adhesive layer 55 may be the same as the material of the adhesive layers 45 and 75 or may differ from the material of the adhesive layers 45 and 75. The thickness of the adhesive layer 55 may be, for example, approximately 5 to 10 μm.

In the semiconductor device 10, the semiconductor elements 50 are mounted on the lower surface 40A of the semiconductor element 40. Thus, the separation distance between the connection pads P2 and the electrode pads 41 is greater than the separation distance between the connection pads P3 and the electrode pads 51. Hence, the height of connection members that connect the connection pads P2 to the electrode pads 41 and the height of connection members that connect the connection pads P3 and the electrode pads 51 are set to different values. The separation distance from the lower surface 40A of the semiconductor element 40 to the upper surface of the solder resist layer 25 may be, for example, approximately 100 to 300 μm. The separation distance from the lower surface 50A of the semiconductor element 50 to the upper surface of the solder resist layer 25 may be, for example, approximately 10 to 50 μm.

The connection structure of the connection pad P2 and the electrode pad 41 and the connection structure of the connection pad P3 and the electrode pad 51 will now be described.

A metal post 81 is formed on the lower surface of each electrode pad 41. The metal post 81 is a rod-shaped connection terminal extending upward from the lower surface of the electrode pad 41. In the present example, the metal post 81 is circular rod-shaped. The height of the metal post 81 may be, for example, approximately 15 to 30 μm. The diameter of the lower surface of the metal post 81 may be, for example, approximately 60 to 150 μm. The material of the metal post 81 may be, for example, copper or a copper alloy.

A core solder ball 30 is formed on each connection pad P2. In the example illustrated in FIG. 2, the core solder ball 30 is mounted on (bonded to) the upper surface of the wiring layer 24 (i.e., connection pad P2) exposed from the solder resist layer 25. In the present example, the core solder ball 30 includes a spherical copper core ball 31 and solder 32 covering the periphery of the copper core ball 31. The core solder ball 30 (copper core ball 31 and solder 32) projects upward beyond the upper surface of the solder resist layer 25. In the present example, the core solder ball 30 is wider than the connection pad P2 in a planar direction (horizontal direction, which is orthogonal to a stacking direction in which the mount portion 12 is stacked on the wiring substrate 11). The height (diameter) of the copper core ball 31 may be, for example, approximately 50 to 150 μm, and the thickness of the solder 32 may be, for example, approximately 5 to 20 μm. The height (diameter) of the core solder ball 30 may be, for example, approximately 60 to 190 μm.

The electrode pads 41 of the semiconductor element 40 are electrically connected to the connection pads P2 of the wiring substrate 11 via the metal posts 81 and the core solder balls 30. Thus, the connection members that electrically connect the semiconductor element 40 to the wiring substrate 11 may be stacked structures of the metal posts 81 and the core solder balls 30. In the present example, the metal posts 81 are joined to the core solder balls 30 with a solder layer 82. The solder layer 82 is joined to the metal posts 81 and the solder 32 of the core solder balls 30. Thus, the electrode pads 41 are electrically connected to the connection pads P2 via connection members combining the metal posts 81, the solder layer 82, and the core solder balls 30.

The solder layer 82 may be, for example, plating of lead-free solder. The material of solder plating may be, for example, lead-free solder of tin (Sn)—Ag base, Sn—Cu base, Sn—Ag—Cu base, or Sn-bismuth (Bi) base. In FIG. 2, to facilitate illustration of the solder layer 82 and the solder 32 of the core solder ball 30, both are separated by solid lines. However, the actual interface of the solder layer 82 and the solder 32 may have disappeared and the interface may be unclear.

A metal post 91 is formed on the lower surface of each electrode pad 51 of the semiconductor element 50. The metal post 91 is a rod-shaped connection terminal extending upward from the lower surface of the electrode pad 51. In the present example, the metal post 91 is circular rod-shaped. The height of the metal post 91 may be, for example, approximately 15 to 30 μm. For example, the height of the metal post 91 may differ from the height of the metal post 81 or may be the same as the height of the metal post 81. The diameter of the lower surface of the metal post 91 may be, for example, approximately 60 to 150 μm. The material of the metal post 91 may be, for example, copper or a copper alloy.

The electrode pads 51 of the semiconductor element 50 are electrically connected to the connection pads P3 of the wiring substrate 11 via the metal posts 91. In the present example, the metal posts 91 are joined to the connection pads P3 with a solder layer 92. The solder layer 92 is joined to the connection pads P3 and the metal posts 91. Thus, the electrode pads 51 of the semiconductor element 50 are electrically connected to the connection pads P3 of the wiring substrate 11 via the metal posts 91 and the solder layer 92. The connection members that electrically connect the electrode pads 51 of the semiconductor element 50 to the connection pads P3 of the wiring substrate 11 may be a combination of the metal posts 91 and the solder layer 92 and do not include a core solder ball.

The solder layer 92 may be, for example, plating of lead-free solder. The material of the solder plating may be, for example, lead-free solder of Sn—Ag base, Sn—Cu base, Sn—Ag—Cu base, or Sn—Bi base.

As illustrated in FIG. 1, the gap between the wiring substrate 11 and the mount portion 12 is filled with the underfill resin 13. The underfill resin 13 fills the gap between the semiconductor element 40 and the wiring substrate 11, the gap between the semiconductor element 50 and the wiring substrate 11, and the gap between the heat dissipation plate 60 and the wiring substrate 11. The material of the underfill resin 13 may be, for example, an insulative resin such as epoxy resin.

The semiconductor device 10 described above may be inverted and used or may be disposed at any angle.

In the present embodiment, the semiconductor element 40 is an example of a first semiconductor element, the metal post 81 is an example of a first connection terminal, the semiconductor element 50 is an example of a second semiconductor element, and the metal post 91 is an example of a second connection terminal. Also, the connection pad P2 is an example of a first connection pad, the connection pad P3 is an example of a second connection pad, the core solder ball 30 is an example of a third connection terminal and a solder ball, and the copper core ball 31 is an example of a core ball.

A method for manufacturing the semiconductor device 10 will now be described. To facilitate understanding, portions that ultimately become elements of the semiconductor device 10 are indicated by reference characters used to denote the final elements.

Figure 4A:
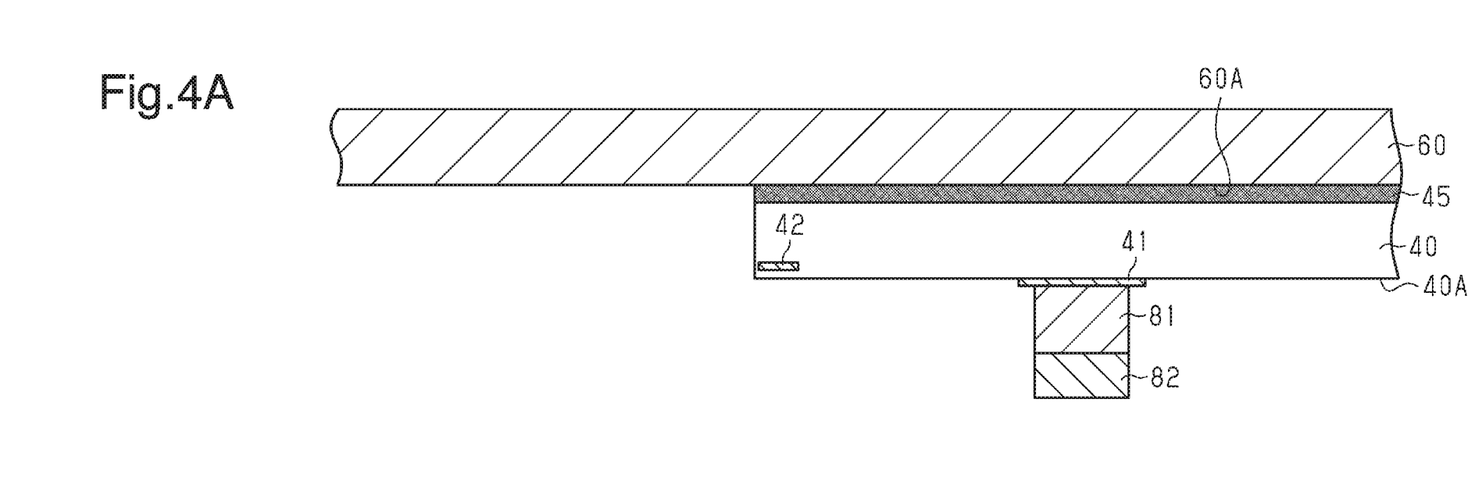
FIGS. 4A, 4B, 5A, 5B, and 6 are enlarged cross-sectional views illustrating a method for manufacturing the semiconductor device illustrated in FIG. 1.

As illustrated in FIG. 4A, the heat dissipation plate 60 is prepared. Also, the semiconductor element 40 in which the metal post 81 and the solder layer 82 are formed on the lower surface of the electrode pad 41 is prepared. The semiconductor element 40 may be manufactured through a known manufacturing process. For example, the semiconductor element 40 may be manufactured through the following processes, which are not illustrated in the drawings nor described in detail.

A given device process is performed to form arrays of multiple devices (e.g., active elements such as CPUs) on a surface of a silicon wafer having a given size. Then, a protection film (not illustrated) of silicon nitride (SiN), phosphosilicate glass (PSG), or the like is formed on the surface including the devices. The protection film is removed with a laser or the like from portions corresponding to the electrode pads 41, which are formed on each device in a given pattern, to expose the lower surfaces of the electrode pads 41. The lower surface of the protection film and the lower surfaces of the electrode pads 41 are covered with a seed layer (not illustrated). Then, a resist layer including openings that expose portions of the seed layer corresponding to the formation region of the metal posts 81 is formed. Electrolytic plating (e.g., electrolytic copper plating) that uses the seed layer as a power feeding layer is performed to form the rod-shaped metal posts 81 on the lower surface of the seed layer (electrode pads 41) exposed from the resist layer. The solder layer 82 is formed on the lower surfaces of the metal posts 81. For example, electrolytic solder plating that uses the resist layer formed on the seed layer as a plating mask and uses the seed layer as a plating power feeding layer is performed to cover the lower surfaces of the metal posts 81 with solder (solder layer 82). Subsequently, unwanted portions of the seed layer and the resist layer are removed. After the silicon wafer is ground to obtain a given thickness (e.g., approximately 500 to 1000 μm), the silicon wafer is singulated to individual devices (having size of, for example, 25 mm×25 mm) with a dicer or the like. The process described above obtains the semiconductor element 40 in which the electrode pads 41 are formed on the circuit formation surface (lower surface 40A) and the metal posts 81 and the solder layer 82 are formed on the lower surfaces of the electrode pads 41.

In the step illustrated in FIG. 4A, the semiconductor element 40 is bonded to the lower surface 60A of the heat dissipation plate 60. For example, the adhesive layer 45 is formed on the lower surface 60A of the heat dissipation plate 60. The adhesive layer 45 may be formed, for example, by applying a liquid or paste of resin to the lower surface 60A of the heat dissipation plate 60. In the step illustrated in FIG. 4A, for example, A-stage (liquid) resin is used as the adhesive layer 45. Alternatively, in the step illustrated in FIG. 4A, semi-cured (B-stage) resin may be used as the adhesive layer 45. Subsequently, the semiconductor element 40 is mounted on the adhesive layer 45 using a mounter or the like. At this time, the semiconductor element 40 is mounted so that the upper surface (rear surface), which is opposite to the circuit formation surface (lower surface 40A), contacts the lower surface of the adhesive layer 45. The semiconductor element 40 is pressed toward the heat dissipation plate 60, and the semiconductor element 40 is bonded to the lower surface 60A of the heat dissipation plate 60 through thermocompression bonding.

Figure 4B:
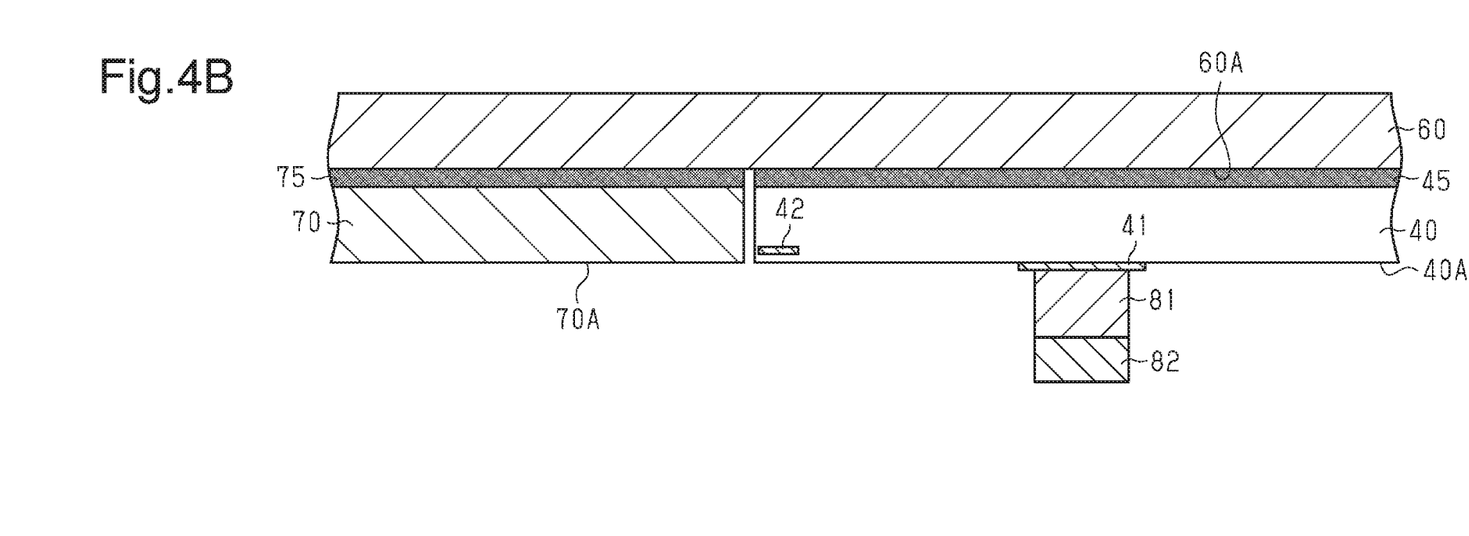

In the step illustrated in FIG. 4B, the spacer 70 is bonded to the lower surface 60A of the heat dissipation plate 60. For example, the adhesive layer 75 is formed on the lower surface 60A of the heat dissipation plate 60. The adhesive layer 75 may be formed, for example, through the same manufacturing method as that of the adhesive layer 45. The spacer 70 is mounted on the adhesive layer 75. The spacer 70 is pressed toward the heat dissipation plate 60, and the spacer 70 is bonded to the heat dissipation plate 60 through thermocompression bonding. At this time, the spacer 70 is bonded to the lower surface 60A of the heat dissipation plate 60 so that the lower surface 70A of the spacer 70 is coplanar with the lower surface 40A of the semiconductor element 40.

Figure 5A:
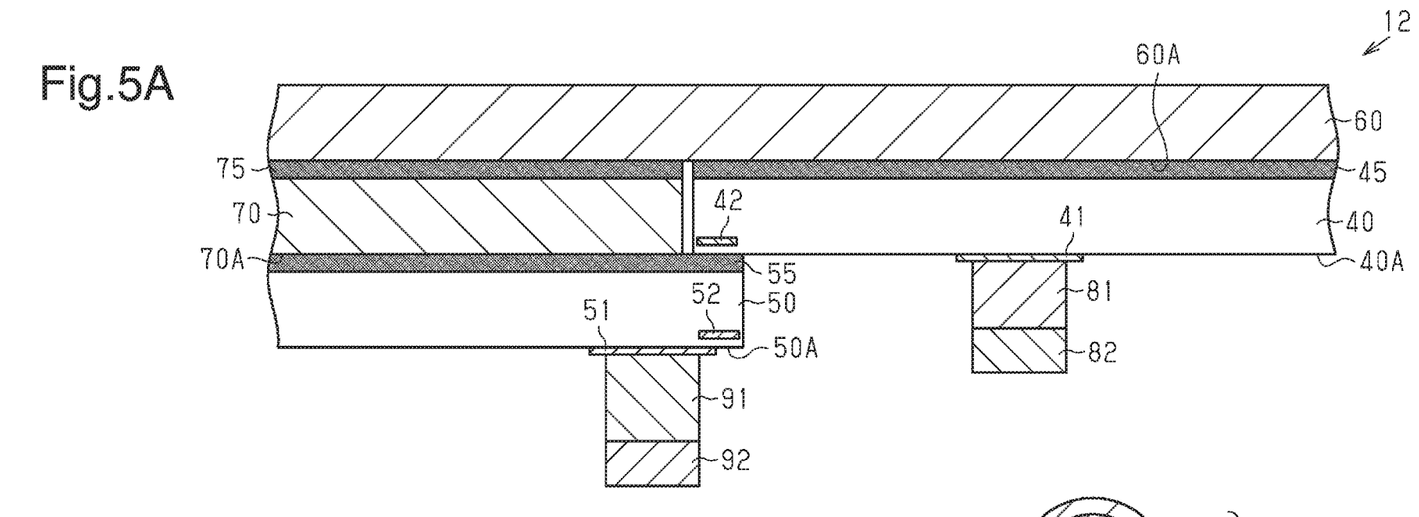

In the step illustrated in FIG. 5A, the semiconductor element 50 in which the metal post 91 and the solder layer 92 are formed on the lower surface of the electrode pad 51 is prepared. The semiconductor element 50 may be formed through the same manufacturing method as that of the semiconductor element 40.

The semiconductor element 50 is bonded to the lower surface 70A of the spacer 70 and the lower surface 40A of the semiconductor element 40. For example, the adhesive layer 55 is formed on the lower surface 70A of the spacer 70 and the lower surface 40A of the semiconductor element 40. The adhesive layer 55 may be formed, for example, through the same manufacturing method as that of the adhesive layer 45. Subsequently, the semiconductor element 50 is mounted on the adhesive layer 55 using a mounter or the like. At this time, the semiconductor element 50 is mounted so that the upper surface (rear surface), which is opposite to the circuit formation surface (lower surface 50A), contacts the lower surface of the adhesive layer 55. The semiconductor element 50 is mounted on the lower surface 40A of the semiconductor element 40 so that the coil 52 incorporated in the semiconductor element 50 overlaps the coil 42 incorporated in the semiconductor element 40 in plan view. The semiconductor element 50 is pressed toward the spacer 70 and the semiconductor element 40, and the semiconductor element 50 is bonded to the spacer 70 and the semiconductor element 40 through thermocompression bonding. In the step illustrated in FIG. 5A, the semiconductor element 50 is mounted on the lower surface 40A of the semiconductor element 40 so that the semiconductor element 50 partially overlaps the semiconductor element 40 in plan view. The manufacturing steps described above manufacture the mount portion 12 illustrated in FIG. 1.

Figure 5B:
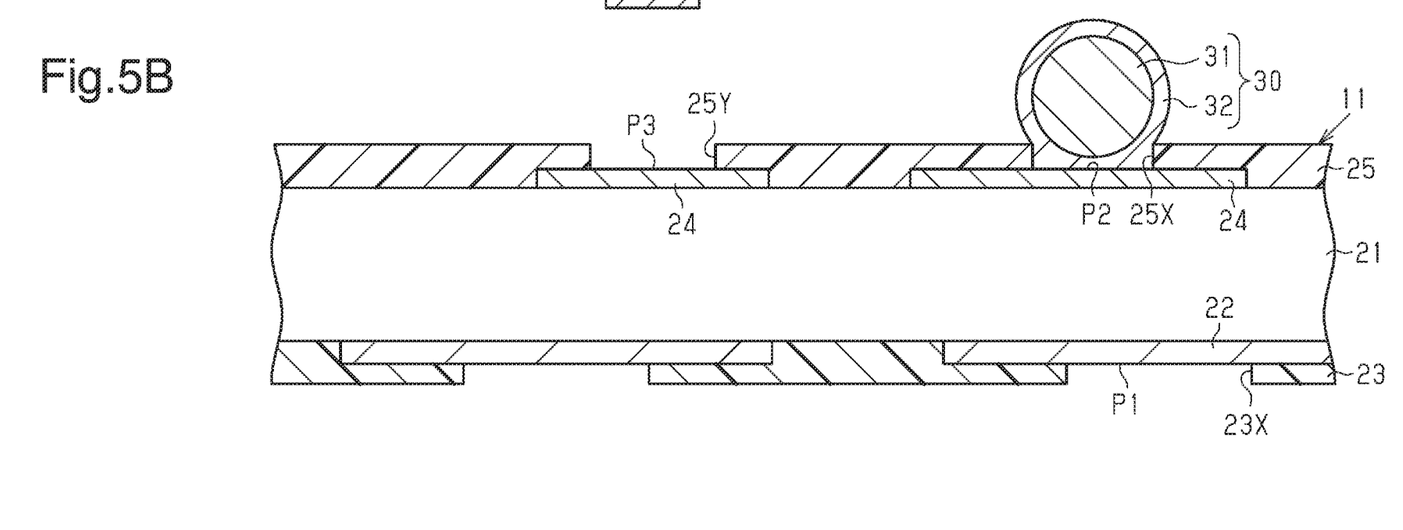

In the step illustrated in FIG. 5B, the wiring substrate 11 is prepared. The wiring substrate 11 may be manufactured through a known manufacturing process. For example, the wiring substrate 11 may be manufactured through the following processes, which are not illustrated in the drawings nor described in detail.

First, a structural body in which the wiring layer 22 is formed on the lower surface of the substrate body 21 and the wiring layer 24 is formed on the upper surface of the substrate body 21 is prepared. Next, the solder resist layer 23 including the openings 23X exposing given portions of the wiring layer 22 as the external connection pads P1 is formed on the lower surface of the substrate body 21. Also, the solder resist layer 25 including the openings 25X and 25Y exposing given portions of the wiring layer 24 as the connection pads P2 and P3 is formed on the upper surface of the substrate body 21. The solder resist layers 23 and 25 may be formed, for example, by laminating the substrate body 21 with a photosensitive solder resist film or applying a liquid solder resist to the substrate body 21 and patterning the resist into a desired shape.

A surface treatment layer may be formed on the external connection pads P1 and the connection pads P2 and P3 as appropriate. Examples of the surface treatment layer include a gold (Au) layer, a nickel (Ni) layer/Au layer (metal layer in which Ni layer is used as bottom layer, and Au layer is formed on Ni layer), a Ni layer/palladium (Pd) layer/Au layer (metal layer in which Ni layer is used as bottom layer, and Ni layer, Pd layer, and Au layer are sequentially stacked). Such a surface treatment layer may be formed, for example, through an electroless plating process. In addition, an anti-oxidation process such as an organic solderability preservative (OSP) process may be performed on the external connection pads P1 and the connection pads P2 and P3 to form a surface treatment layer. The manufacturing steps described above manufacture the wiring substrate 11 illustrated in FIG. 1.

The core solder ball 30 is mounted on (joined to) the connection pad P2. For example, after flux is appropriately applied to the connection pad P2, the core solder ball 30 is mounted. A reflow process is performed at temperatures of approximately 230° C. to 260° C. to fix the core solder ball 30 to the connection pad P2. The surface of the wiring substrate 11 is cleaned so that the flux is removed.

Figure 6:
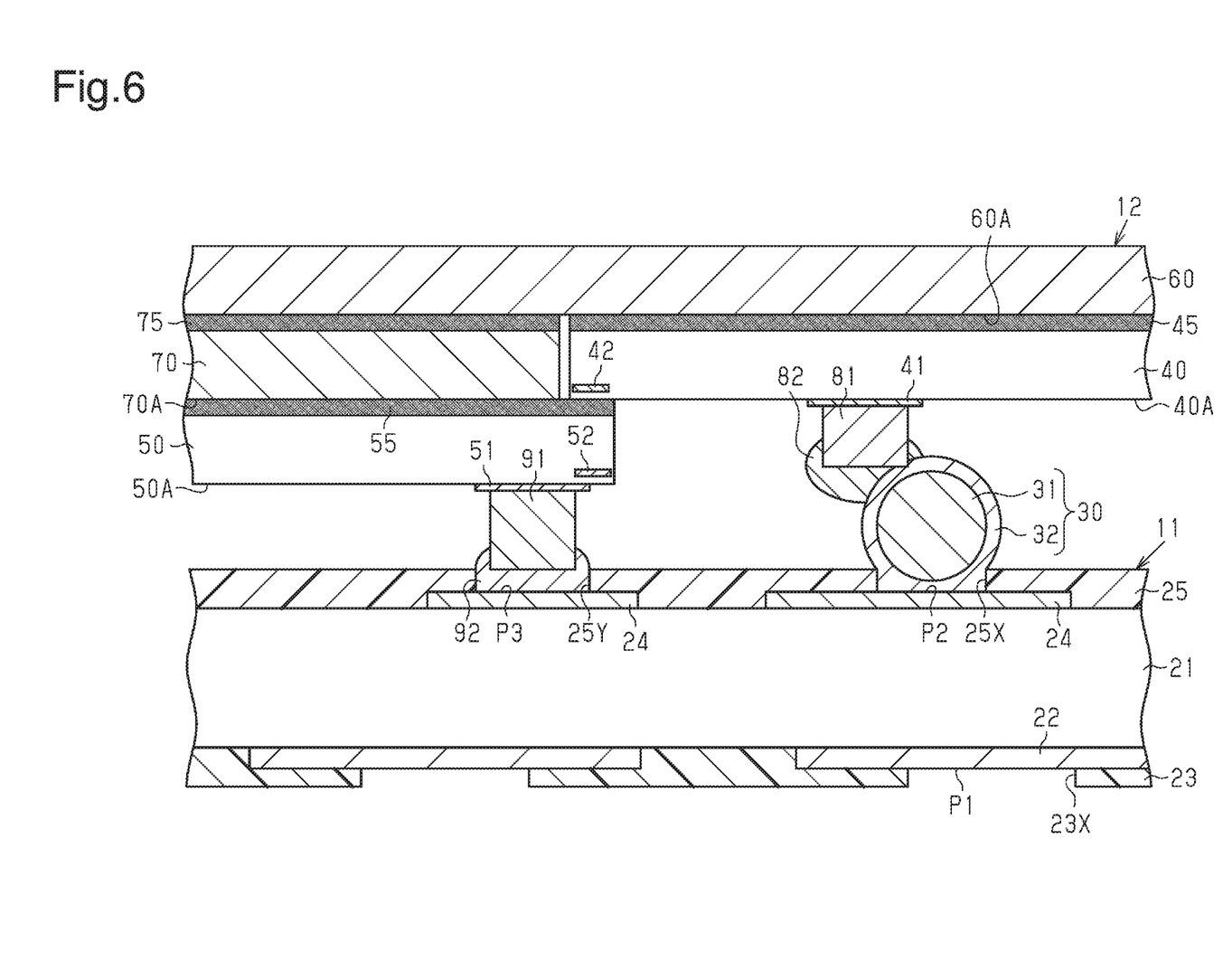

In the step illustrated in FIG. 6, the mount portion 12 is mounted on the wiring substrate 11. The mount portion 12 including the semiconductor elements 40 and 50 and the heat dissipation plate 60 is disposed on the wiring substrate 11. At this time, the mount portion 12 is positioned so that the metal post 81 (electrode pad 41) faces the connection pad P2 and the metal post 91 (electrode pad 51) faces the connection pad P3. The metal post 81 is joined to the core solder ball 30 via the solder layer 82, and the metal post 91 is joined to the connection pad P3 via the solder layer 92. For example, the mount portion 12 is mounted on the wiring substrate 11 so that the metal posts 81 and 91 and the core solder ball 30 are disposed between the wiring substrate 11 and the mount portion 12. The wiring substrate 11 and the mount portion 12 are heated in a reflow oven at temperatures of approximately 230° C. to 260° C. The reflow process is performed, for example, while the mount portion 12 is pressed against the wiring substrate 11. Such a reflow process melts the solder layer 82 and the solder 32 of the core solder ball 30 to form an alloy, and the solder layer 82 and the core solder ball 30 are joined to the metal post 81 and the connection pad P2. As a result, the metal post 81 and the connection pad P2 are electrically connected via the solder layer 82 and the core solder ball 30. The reflow process also melts the solder layer 92 and joins the solder layer 92 to the metal post 91 and the connection pad P3. As a result, the metal post 91 and the connection pad P3 are electrically connected via the solder layer 92.

In the step of mounting the mount portion 12 on the wiring substrate 11, manufacturing errors or the mounting precision may result in misalignment of the metal post 81 with the connection pad P2 in the planar direction (horizontal direction) as illustrated in FIG. 6. In the present example, the core solder ball 30 is formed on the connection pad P2, and the solder 32 is spherically formed on the periphery of the core solder ball 30. The solder 32 is sterically (three-dimensionally) formed on the connection pad P2 to extend in the planar direction. Thus, even when the metal post 81 is misaligned with the connection pad P2 in the planar direction, the misalignment amount may be reduced by the core solder ball 30. Therefore, even when the metal post 81 is misaligned with the connection pad P2 in the planar direction, the core solder ball 30 electrically connects the metal post 81 and the connection pad P2 in a satisfactory manner.

Subsequently, the gap between the mount portion 12 and the wiring substrate 11 is filled with the underfill resin 13 illustrated in FIG. 1, and the underfill resin 13 is cured. The external connection terminals 14 illustrated in FIG. 1 are formed on the external connection pads P1. The manufacturing steps described above manufacture the semiconductor device 10 illustrated in FIG. 1.

The present embodiment has the advantages described below.

(1) The semiconductor device 10 includes the semiconductor element 40, the semiconductor element 50 mounted on the lower surface 40A of the semiconductor element 40, and the wiring substrate 11 on which the semiconductor elements 40 and 50 are mounted. The semiconductor device 10 further includes the stacked structures of the metal posts 81 and the core solder balls 30 as connection members that electrically connect the wiring substrate 11 and the semiconductor element 40. In the present example, the solder 32 is spherically formed on the periphery of the core solder balls 30. The solder 32 is sterically (three-dimensionally) formed to extend in the planar direction. Thus, even when the metal posts 81 are misaligned with the connection pads P2 in the planar direction, the misalignment amount is reduced with the core solder balls 30 so that the metal posts 81 are electrically connected to the connection pads P2 via the core solder balls 30. This reduces occurrence of open-circuit defects, in which the metal post 81 and the connection pad P2 are separated and electrically disconnected from each other, and improves the connection reliability of the wiring substrate 11 and the semiconductor element 40.

(2) The combination of the metal post 81 and the core solder ball 30 reduces the height of the metal post 81 as compared to a case in which the wiring substrate 11 and the semiconductor element 40 are connected by only the metal post 81. This shortens the manufacturing time for forming the metal posts 81 (e.g., plating time) and improves the productivity of the semiconductor device 10.

(3) The semiconductor element 50 is mounted on the lower surface 40A of the semiconductor element 40 so that the semiconductor element 50 partially overlaps the semiconductor element 40 in plan view. This limits increases in the size of the semiconductor device 10 in the planar direction.

(4) The heat dissipation plate 60 is mounted on the upper surface of the semiconductor element 40. The semiconductor element 40 is thermally coupled to the heat dissipation plate 60 so that heat generated in the semiconductor element 40 is transmitted to the heat dissipation plate 60. Thus, heat generated in the semiconductor element 40 efficiently dissipates from the heat dissipation plate 60. This limits increases in the temperature of the semiconductor element 40.

(5) The spacer 70 is mounted on the lower surface 60A of the heat dissipation plate 60, and the semiconductor element 50 is mounted on the lower surface 70A of the spacer 70. The spacer 70 improves the precision of positioning the semiconductor element 50 in the stacking direction (vertical direction illustrated in, for example, FIG. 1).

(6) The semiconductor element 50 is mounted on the lower surface 70A of the spacer 70 and the lower surface 40A of the semiconductor element 40 that are coplanar with each other. This appropriately limits inclinations of the semiconductor element 50, which is mounted on the lower surface 70A of the spacer 70 and the lower surface 40A of the semiconductor element 40, in the stacking direction (vertical direction illustrated in, for example, FIG. 1).

(7) The semiconductor elements 40 and 50 respectively include the coils 42 and 52. The coil 42 of the semiconductor element 40 is magnetically coupled to the coil 52 of the semiconductor element 50. In this configuration, the semiconductor elements 40 and 50 overlap in plan view so that the coil 42 and the coil 52 overlap in plan view. This connects the semiconductor element 40 to the semiconductor element 50.

(8) The side surfaces of the spacers 70 are separated from the side surfaces of the heat dissipation plate 60 toward the inner side of the semiconductor device 10. The side surfaces of the semiconductor elements 50 are separated from the side surfaces of the spacers 70 toward the inner side of the semiconductor device 10. Thus, the side surfaces of the heat dissipation plate 60, the side surfaces of the spacers 70, and the side surfaces of the semiconductor elements 50 are formed in a stepped manner (refer to FIGS. 1 and 3). This increases the area of contact of the underfill resin 13 with the heat dissipation plate 60, the spacers 70, and the semiconductor elements 50 as compared to a case in which the side surfaces of the heat dissipation plate 60, the spacers 70, and the semiconductor elements 50 are flush with each other at the side surfaces of the semiconductor device 10. Thus, the adhesiveness of the underfill resin 13 to the heat dissipation plate 60, the spacers 70, and the semiconductor elements 50 is improved. Accordingly, the underfill resin 13 further appropriately protects the portions connecting the semiconductor elements 40 and 50 to the wiring substrate 11. This improves the reliability of the semiconductor device 10.

It should be apparent to those skilled in the art that the foregoing embodiments may be implemented in many other specific forms without departing from the scope of this disclosure. Particularly, it should be understood that the foregoing embodiments may be implemented in the following forms.

The embodiment described above and the modified examples described below may be combined as long as the combined modifications remain technically consistent with each other.

In the embodiment, the semiconductor elements 40 and 50 are magnetically coupled to each other. However, the process of connecting the semiconductor elements 40 and 50 is not limited to such a configuration.

Figure 7:
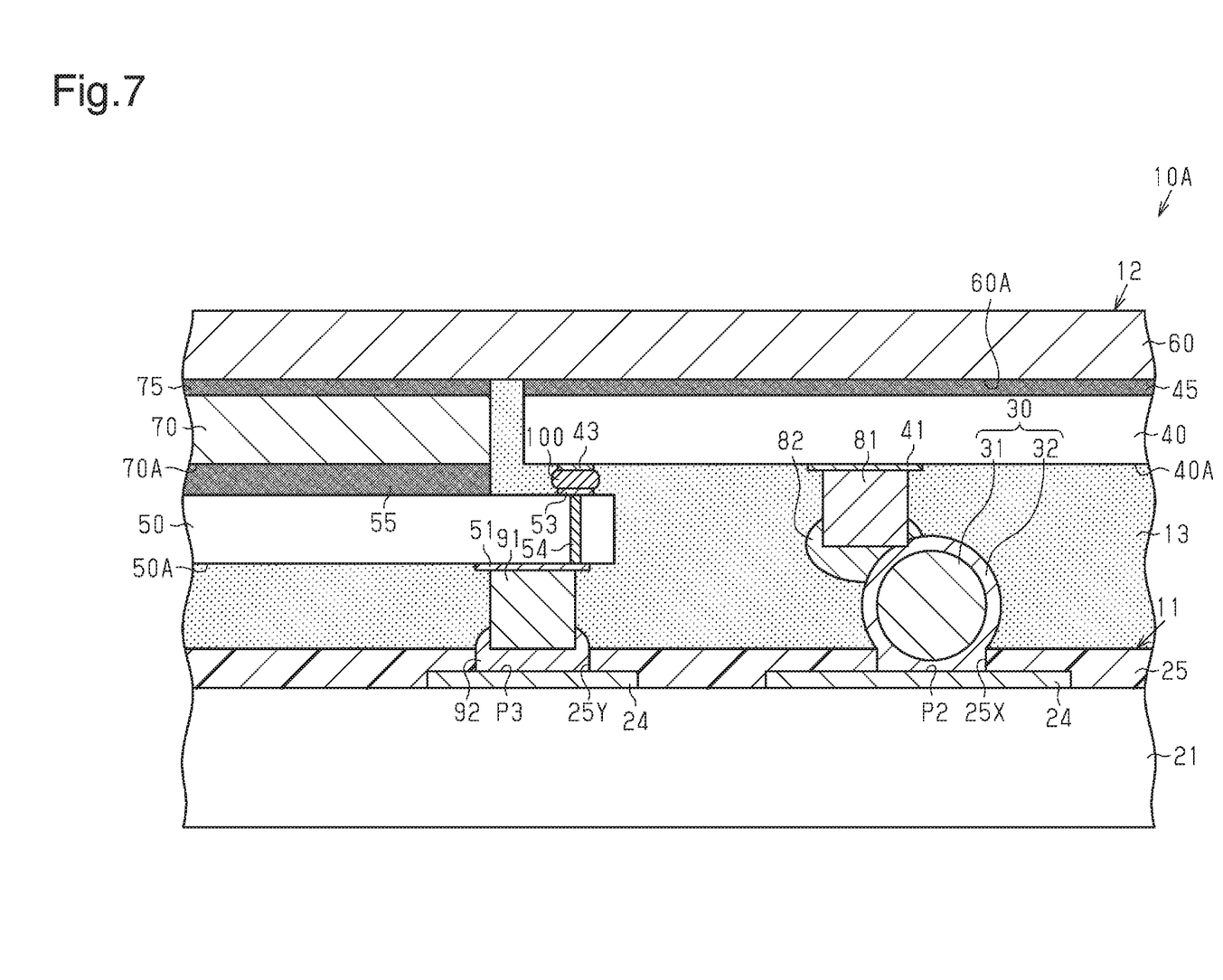
FIG. 7 is an enlarged cross-sectional view illustrating a modified example of a semiconductor device.

For example, as illustrated in FIG. 7, the semiconductor element 40 and the semiconductor element 50 are electrically connected. FIG. 7 illustrates a semiconductor device 10A in which a wiring pattern 43 is formed on the lower surface 40A of the semiconductor element 40 and a wiring pattern 53 is formed on the upper surface of the semiconductor element 50. The wiring pattern 53 is, for example, electrically connected to the electrode pad 51 via a through electrode 54 extending through the semiconductor element 50 in the thickness-wise direction. The semiconductor element 50 is mounted on the lower surface 40A of the semiconductor element 40 so that the semiconductor element 50 partially overlaps the semiconductor element 40 in plan view. In the example illustrated in FIG. 7, the wiring pattern 53 of the semiconductor element 50 is electrically connected to the wiring pattern 43 of the semiconductor element 40 via a bump 100. Thus, the wiring pattern 43 of the semiconductor element 40 is electrically connected to the electrode pad 51 via the bump 100, the wiring pattern 53, and the through electrode 54. An example of the bump 100 is a solder bump.

In the example illustrated in FIG. 7, the adhesive layer 55 has a relatively great thickness so that the space for the wiring pattern 43, the bump 100, and the wiring pattern 53 is obtained. Alternatively, for example, the thickness of the spacers 70 and/or the thickness of the adhesive layer 75 may be adjusted to obtain the space for the wiring pattern 43, the bump 100, and the wiring pattern 53.

In the embodiment, the semiconductor elements 40 and 50 do not have to be connected to each other as long as the semiconductor elements 40 and 50 are electrically connected to the wiring substrate 11.

In the embodiment, the copper core ball 31 is used as the conductive core ball of the core solder ball 30. Alternatively, the conductive core ball may be formed from, for example, a metal other than copper such as gold or nickel. Further, a resin core ball formed from resin may be used instead of a conductive core ball. A solder ball that does not include a core ball such as a conductive core ball or a resin core ball may be used instead of the core solder ball 30.

In the embodiment, the metal posts 81 are used as the first connection terminals formed on the electrode pads 41 of the semiconductor element 40, and the core solder balls 30 are used as the third connection terminals formed on the connection pads P2 of the wiring substrate 11. Instead, for example, the core solder balls 30 may be used as the first connection terminals formed on the electrode pads 41 of the semiconductor element 40, and the metal posts 81 may be used as the third connection terminals formed on the connection pads P2 of the wiring substrate 11.

In the embodiment, the solder layers 82 and 92 may be omitted. For example, the metal posts 81 may be joined to the solder 32, and the metal posts 91 may be joined to the connection pads P3.

In the embodiment, liquid or paste of resin is used as the adhesive layers 45, 55, and 75. Instead, for example, a film of a semi-cured (B-stage) adhesive (adhesive film) may be used as the adhesive layers 45, 55, and 75. For example, an epoxy-based, polyimide-based, or silicone-based thermosetting adhesive may be used as the adhesive film. A manufacturing method using the adhesive film as the adhesive layers 45, 55, and 75 will now be described.

An example of a process for bonding the semiconductor element 40 to the lower surface 60A of the heat dissipation plate 60 will now be described. For the sake of convenience, FIG. 4A will be referred to in the following.

The metal posts 81 and the solder layer 82 are formed on a silicon wafer that will be used as the semiconductor element 40. After the silicon wafer is ground to a given reduced thickness, a semi-cured adhesive film is applied to the rear surface of the silicon wafer to form the adhesive layer 45. The silicon wafer is diced to be separated into individual semiconductor elements 40 including the adhesive layer 45 on the rear surface. The semiconductor element 40 is pressed toward the lower surface 60A of the heat dissipation plate 60 with application of heat so that the adhesive layer 45 is cured to bond the semiconductor element 40 to the lower surface 60A of the heat dissipation plate 60.

An example of a process for bonding the spacer 70 to the lower surface 60A of the heat dissipation plate 60 will now be described. For the sake of convenience, FIG. 4B will be referred to in the following.

A semi-cured adhesive film is applied to the rear surface of a larger substrate that will be used as the spacer 70 to form the adhesive layer 75. The large substrate is cut and separated into individual spacers 70 including the adhesive layer 75 on the rear surface (upper surface in FIG. 4B). The spacer 70 is pressed toward the lower surface 60A of the heat dissipation plate 60 with application of heat so that the adhesive layer 75 is cured to bond the spacer 70 to the lower surface 60A of the heat dissipation plate 60.

An example of a process for bonding the semiconductor element 50 to the spacer 70 and the semiconductor element 40 will now be described. For the sake of convenience, FIG. 5A will be referred to in the following.

The metal posts 91 and the solder layer 92 are formed on a silicon wafer that will be used as the semiconductor element 50. After the silicon wafer is ground to a given reduced thickness, a semi-cured adhesive film is applied to the rear surface of the silicon wafer to form the adhesive layer 55. The silicon wafer is diced to be separated into individual semiconductor elements 50 including the adhesive layer 55 on the rear surface. The semiconductor element 50 is pressed toward the lower surface 70A of the spacer 70 and the lower surface 40A of the semiconductor element 40 with application of heat so that the adhesive layer 55 is cured to bond the semiconductor element 50 to the lower surface 70A of the spacer 70 and the lower surface 40A of the semiconductor element 40.

In the embodiment, the adhesive layer 45 and the adhesive layer 75 may be integrally formed.

In the embodiment, after the semiconductor element 40 is bonded to the lower surface 60A of the heat dissipation plate 60 with the adhesive layer 45, the spacers 70 are bonded to the lower surface 60A of the heat dissipation plate 60 with the adhesive layer 75. Instead, for example, the semiconductor element 40 and the spacers 70 may be simultaneously bonded to the lower surface 60A of the heat dissipation plate 60. In this case, for example, the adhesive layer 45 and the adhesive layer 75 are thermally cured at the same time.

In the embodiment, the spacers 70 may be omitted. In this case, for example, the gap between the upper surface of the semiconductor element 50 and the heat dissipation plate 60 may be filled with the underfill resin 13.

In the embodiment, the heat dissipation plate 60 may be omitted.

In the embodiment, the underfill resin 13 may be omitted.

In the embodiment, a logic chip is used as the semiconductor element 40, and a memory chip is used as the semiconductor element 50. Instead, for example, a memory chip may be used as the semiconductor element 40, and a logic chip may be used as the semiconductor element 50.

In the embodiment, the semiconductor element 40, which is an MPU (i.e., logic chip), and the semiconductor element 50, which is a DRAM chip (i.e., memory chip), are combined and mounted on the single wiring substrate 11. Instead, both the semiconductor elements 40 and 50 may be logic chips. Both the semiconductor elements 40 and 50 may be memory chips.

In the embodiment, all of the semiconductor elements 50 mounted on the lower surface 40A of the semiconductor element 40 are DRAM chips. Instead, a combination of different kinds of chips, for example, a DRAM chip, an SRAM chip, and a CPU chip, may be used as the semiconductor elements 50.

Clause

This disclosure further encompasses the following embodiment.

1. A method for manufacturing a semiconductor device, the method including:
preparing a first semiconductor element;
forming a first connection terminal on a lower surface of the first semiconductor element;
preparing a second semiconductor element;
forming a second connection terminal on a lower surface of the second semiconductor element;
mounting the second semiconductor element on the lower surface of the first semiconductor element so that the second semiconductor element partially overlaps the first semiconductor element in plan view;
preparing a wiring substrate including a first connection pad and a second connection pad;
forming a third connection terminal on the first connection pad; and
mounting the first semiconductor element and the second semiconductor element over the wiring substrate to electrically connect the first connection terminal to the first connection pad via the third connection terminal and electrically connect the second connection terminal to the second connection pad, wherein
one of the first connection terminal and the third connection terminal is a metal post, and
the other one of the first connection terminal and the third connection terminal is a solder ball.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

The invention claimed is:

1. A semiconductor device, comprising:
a first semiconductor element;
a first connection terminal formed on a lower surface of the first semiconductor element;
a second semiconductor element mounted on the lower surface of the first semiconductor element so that the second semiconductor element partially overlaps the first semiconductor element in plan view;
a second connection terminal formed on a lower surface of the second semiconductor element;
a wiring substrate including a first connection pad electrically connected to the first connection terminal and a second connection pad electrically connected to the second connection terminal, wherein the first semiconductor element and the second semiconductor element are mounted over the wiring substrate;
a third connection terminal formed on the first connection pad and electrically connected to the first connection terminal;
a heat dissipation plate mounted on an upper surface of the first semiconductor element;

a spacer formed on a lower surface of the heat dissipation plate, wherein the second semiconductor element is mounted on a lower surface of the spacer; and an underfill resin with which a gap between the heat dissipation plate and the wiring substrate is filled to encapsulate the first semiconductor element and the second semiconductor element, wherein the first connection terminal is a metal post, the third connection terminal is a core solder ball, the core solder ball includes a spherical core ball and solder covering a periphery of the core ball, the metal post is electrically connected to the core solder ball via a first solder layer, a side surface of the spacer is separated from a side surface of the heat dissipation plate toward an inner side of the semiconductor device, a side surface of the second semiconductor element is separated from the side surface of the spacer further toward the inner side of the semiconductor device, the side surface and the lower surface of the heat dissipation plate, the side surface and the lower surface of the spacer, and the side surface and the lower surface of the second semiconductor element are formed in a stepped manner the lower surface of the spacer is coplanar with the lower surface of the first semiconductor element, and the second semiconductor element is bonded to the lower surface of the spacer and the lower surface of the first semiconductor element.

2. The semiconductor device according to claim 1, wherein a stacked structure of the metal post and the core solder ball is connected between the first semiconductor element and the wiring substrate; and the core solder ball has a diameter that is greater than a height of the metal post.

3. The semiconductor device according to claim 1, wherein the second connection terminal is a metal post; and the core solder ball has a diameter that is greater than a height of the metal post of the second connection terminal.

4. The semiconductor device according to claim 1, wherein the first semiconductor element includes a first coil, the second semiconductor element includes a second coil that differs from the first coil, and the first coil of the first semiconductor element is magnetically coupled to the second coil of the second semiconductor element.

5. The semiconductor device according to claim 1, wherein the second connection terminal is electrically connected to the second connection pad via a second solder layer that differs from the first solder layer.

6. The semiconductor device according to claim 1, wherein the first solder layer includes a portion extending outside the core solder ball in a plan view.

* * * * *